(12) United States Patent
Cain

(10) Patent No.: US 12,387,877 B2
(45) Date of Patent: Aug. 12, 2025

(54) MULTILAYER CERAMIC CAPACITOR

(71) Applicant: KYOCERA AVX Components Corporation, Fountain Inn, SC (US)

(72) Inventor: Jeffrey Cain, Greenville, SC (US)

(73) Assignee: KYOCERA AVX Components Corporation, Fountain Inn, SC (US)

(*) Notice: Subject to any disclaimer, the term of this patent is extended or adjusted under 35 U.S.C. 154(b) by 410 days.

(21) Appl. No.: 17/859,122

(22) Filed: Jul. 7, 2022

(65) Prior Publication Data

US 2023/0019800 A1 Jan. 19, 2023

Related U.S. Application Data

(60) Provisional application No. 63/219,559, filed on Jul. 8, 2021.

(51) Int. Cl.
| | |
|---|---|
| *H01G 4/232* | (2006.01) |
| *H01G 4/005* | (2006.01) |
| *H01G 4/30* | (2006.01) |
| *H05K 1/18* | (2006.01) |

(52) U.S. Cl.
CPC ........... *H01G 4/2325* (2013.01); *H01G 4/005* (2013.01); *H01G 4/30* (2013.01); *H05K 1/181* (2013.01); *H05K 2201/10015* (2013.01)

(58) Field of Classification Search
CPC ........ H01G 4/005; H01G 4/012; H01G 4/232; H01G 4/2325; H01G 4/30; H05K 1/181; H05K 2001/10015
See application file for complete search history.

(56) References Cited

U.S. PATENT DOCUMENTS

| | | |
|---|---|---|
| 4,831,494 A | 5/1989 | Arnold et al. |
| 5,583,738 A | 12/1996 | Kohno |
| 5,880,925 A | 3/1999 | DuPre et al. |
| 6,243,253 B1 | 6/2001 | DuPre et al. |
| 6,292,351 B1 | 9/2001 | Ahiko et al. |
| 6,459,561 B1 | 10/2002 | Galvagni et al. |

(Continued)

FOREIGN PATENT DOCUMENTS

| | | |
|---|---|---|
| JP | 2005150283 | 6/2005 |
| JP | 2008022017 | 1/2008 |

OTHER PUBLICATIONS

International Search Report and Written Opinion for PCT/US2022/036296 dated Nov. 3, 2022, 7 pages.

*Primary Examiner* — Nathan Milakovich
(74) *Attorney, Agent, or Firm* — Dority & Manning, P.A.

(57) ABSTRACT

The present invention is directed to a multilayer capacitor and a circuit board containing the multilayer capacitor. The capacitor includes a main body containing a set of alternating dielectric layers and internal electrode layers. Each internal electrode layer includes a top edge, a bottom edge, and two side edges extending between the top and bottom edges that define a main body; at least one lead tab extending from the top edge; and at least one lead tab extending from the bottom edge. At least one lead tab extending from the top edge and at least one lead tab extending from the bottom edge include a lateral edge aligned with a side edge of the main body. External terminals electrically connected to the internal electrode layers are formed on a top surface of the capacitor, a bottom surface of the capacitor, and an end surface between the top and bottom surfaces.

20 Claims, 2 Drawing Sheets

(56) References Cited

U.S. PATENT DOCUMENTS

| | | |
|---|---|---|
| 6,477,032 B2 | 11/2002 | Makl, Jr. |
| 6,496,355 B1 | 12/2002 | Galvagni et al. |
| 6,532,143 B2 | 3/2003 | Figueroa et al. |
| 6,757,152 B2 | 6/2004 | Galvagni et al. |
| 6,795,294 B2 | 9/2004 | Kuroda et al. |
| 6,950,300 B2 | 9/2005 | Sutardja |
| 7,068,490 B2 | 6/2006 | Prymak |
| 7,177,137 B2 | 2/2007 | Ritter et al. |
| 7,310,217 B2 | 12/2007 | Takashima et al. |
| 7,317,622 B2 | 1/2008 | Li |
| 7,414,857 B2 | 8/2008 | Ritter et al. |
| 7,463,474 B2 | 12/2008 | Ritter et al. |
| 7,545,623 B2 | 6/2009 | Randall et al. |
| 7,576,968 B2 | 8/2009 | Ritter et al. |
| 7,633,739 B2 | 12/2009 | Devoe |
| 7,701,695 B2 | 4/2010 | Sutardja |
| 7,724,496 B2 | 5/2010 | Eggerding et al. |
| 7,724,498 B2 | 5/2010 | Mosley et al. |
| 8,045,319 B2 | 10/2011 | Ritter et al. |
| 8,238,116 B2 | 8/2012 | Eggerding et al. |
| 9,613,755 B2 | 4/2017 | Oh et al. |
| 10,204,737 B2 | 2/2019 | Ritter et al. |
| 2004/0042156 A1 | 3/2004 | Devoe et al. |
| 2004/0124511 A1 | 7/2004 | Li |
| 2004/0125580 A1 | 7/2004 | Chung et al. |
| 2004/0136141 A1 | 7/2004 | Korony et al. |
| 2004/0223289 A1 | 11/2004 | Kuroda et al. |
| 2004/0257748 A1 | 12/2004 | Ritter |
| 2005/0046536 A1 | 3/2005 | Ritter et al. |
| 2007/0019364 A1 | 1/2007 | Roy |
| 2007/0035014 A1 | 2/2007 | Fung |
| 2007/0121275 A1 | 5/2007 | Takashima et al. |
| 2007/0133147 A1 | 6/2007 | Ritter et al. |
| 2007/0165361 A1 | 7/2007 | Randall et al. |
| 2007/0188975 A1 | 8/2007 | Togashi et al. |
| 2008/0049377 A1 | 2/2008 | Sutardja |
| 2008/0123247 A1 | 5/2008 | Randall et al. |
| 2008/0174934 A1 | 7/2008 | Togashi |
| 2008/0180879 A1 | 7/2008 | Lee |
| 2008/0253059 A1* | 10/2008 | Eggerding ............... H01G 4/30 29/25.42 |
| 2009/0002921 A1 | 1/2009 | Ritter et al. |
| 2009/0201624 A1 | 8/2009 | Hattori et al. |
| 2009/0284897 A1 | 11/2009 | Itamura |
| 2009/0291317 A1 | 11/2009 | Kawasaki et al. |
| 2010/0039749 A1 | 2/2010 | Ritter et al. |
| 2010/0188799 A1 | 7/2010 | Galvagni et al. |
| 2011/0080683 A1 | 4/2011 | Jones et al. |
| 2011/0250791 A1 | 10/2011 | Straka et al. |
| 2014/0252544 A1 | 9/2014 | Li et al. |
| 2015/0014037 A1 | 1/2015 | Ahn et al. |
| 2015/0016016 A1 | 1/2015 | Lee et al. |
| 2015/0229446 A1 | 8/2015 | Feng |
| 2015/0243438 A1 | 8/2015 | Ahn et al. |
| 2015/0243440 A1 | 8/2015 | Gong et al. |
| 2015/0294791 A1 | 10/2015 | Hwang et al. |
| 2015/0348711 A1 | 12/2015 | Kim et al. |
| 2016/0020025 A1 | 1/2016 | Yao |
| 2016/0027582 A1 | 1/2016 | Ahn et al. |
| 2016/0126013 A1* | 5/2016 | Park ....................... H01G 4/232 361/301.4 |
| 2016/0142033 A1 | 5/2016 | Chong et al. |
| 2016/0189864 A1 | 6/2016 | Ritter et al. |
| 2016/0351504 A1 | 12/2016 | Teshima et al. |
| 2016/0381802 A1 | 12/2016 | Taniguchi et al. |
| 2017/0047168 A1 | 2/2017 | Lee et al. |
| 2018/0090273 A1 | 3/2018 | Hwang et al. |
| 2018/0330880 A1* | 11/2018 | Cain ...................... H01G 4/012 |
| 2018/0330881 A1* | 11/2018 | Cain ...................... H01G 4/30 |
| 2019/0006104 A1 | 1/2019 | Cain |
| 2024/0145169 A1* | 5/2024 | Berolini ................. H01G 4/232 |
| 2024/0145172 A1* | 5/2024 | Berolini ................. H01G 4/30 |
| 2024/0145176 A1* | 5/2024 | Berolini ................. H01G 4/232 |
| 2024/0145449 A1* | 5/2024 | Desclos ................. H01L 23/66 |
| 2024/0145451 A1* | 5/2024 | Desclos ................. H01L 23/5386 |
| 2024/0145452 A1* | 5/2024 | Desclos ................. H01L 23/642 |
| 2024/0145528 A1* | 5/2024 | Desclos ................. H01L 25/0652 |
| 2024/0145529 A1* | 5/2024 | Desclos ................. H01L 25/0652 |

* cited by examiner

MULTILAYER CERAMIC CAPACITOR

CROSS-REFERENCE TO RELATED APPLICATION

The present application claims filing benefit of U.S. Provisional Patent Application Ser. No. 63/219,559 having a filing date of Jul. 8, 2021, and which is incorporated herein by reference in its entirety.

BACKGROUND OF THE SUBJECT MATTER

Multilayer capacitors are generally constructed having a plurality of dielectric layers and internal electrode layers arranged in a stack. During manufacture, the stacked dielectric layers and internal electrode layers are pressed and sintered to achieve a substantially unitary capacitor body. In an attempt to improve upon the performance of these capacitors, various configurations and designs have been employed for the dielectric layers and the internal electrode layers.

However, as rapid changes occur in the electronics industry requiring new performance criteria, these configurations are commonly manipulated. In particular, various application design considerations have created a need to redefine the capacitor parameters and its performance in high-speed environments, especially in light of faster and denser integrated circuits. For instance, larger currents, denser circuit boards and spiraling costs have all served to focus upon the need for better and more efficient capacitors. Additionally, the design of various electronic components has been driven by a general industry trend toward miniaturization, as well as increased functionality.

In such regard, a need exists for providing a capacitor with improved operational characteristics.

SUMMARY OF THE SUBJECT MATTER

In accordance with one embodiment of the present invention, a multilayer capacitor is disclosed. The capacitor comprises a main body containing a set of alternating dielectric layers and internal electrode layers wherein the set contains a first internal electrode layer and a second internal electrode layer and each internal electrode layer includes a top edge, a bottom edge opposite the top edge, and two side edges extending between the top edge and the bottom edge that define a main body of the internal electrode layer. Each internal electrode layer contains at least one lead tab extending from the top edge of the main body of the internal electrode layer and at least one lead tab extending from the bottom edge of the main body of the internal electrode layer, wherein at least one lead tab extending from the top edge of the main body of the internal electrode layer and at least one lead tab extending from the bottom edge of the main body of the internal electrode layer include a lateral edge aligned with a side edge of the main body of the internal electrode layer. External terminals are electrically connected to the internal electrode layers wherein the external terminals are formed on a top surface of the capacitor, a bottom surface of the capacitor opposing the top surface of the capacitor, and extending along an end surface between the top surface and the bottom surface.

Other features and aspects of the present invention are set forth in greater detail below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

DETAILED DESCRIPTION OF THE SUBJECT MATTER

Figure 1A:
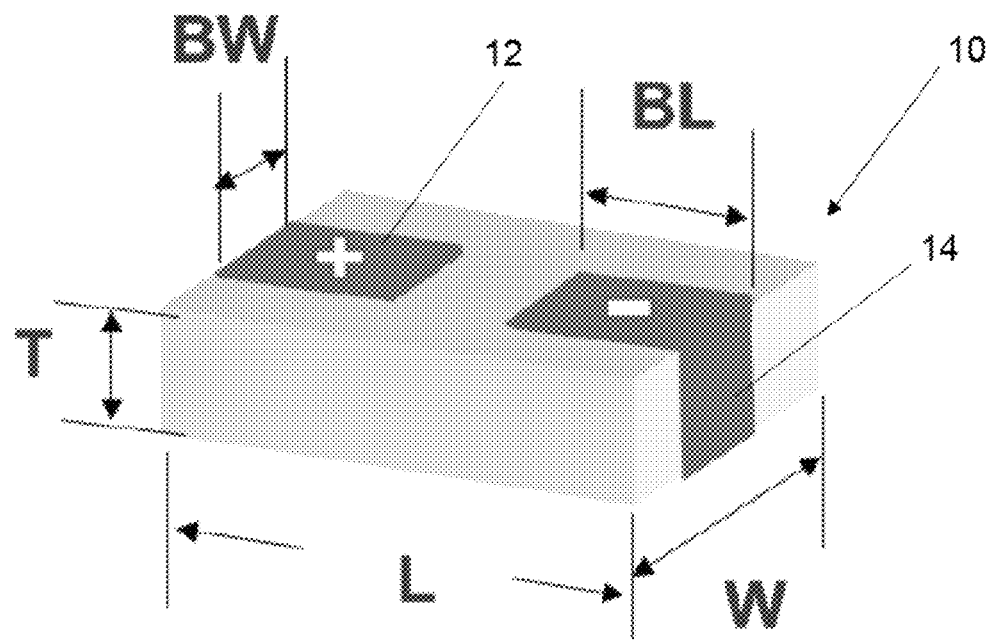
FIG. 1A illustrates a generally top and sides external perspective view of one embodiment of a capacitor including two external terminals in accordance with the present invention.

It is to be understood by one of ordinary skill in the art that the present discussion is a description of exemplary embodiments only, and is not intended as limiting the broader aspects of the present invention.

Generally speaking, the present invention is directed to a multilayer capacitor. The multilayer capacitor contains at least one capacitive element within a main body. In particular, the at least one capacitive element is within a single, unitary package. In this regard, the multilayer capacitor contains a set of alternating dielectric layers and internal electrode layers. In general, a set of alternating dielectric layers and internal electrode layers defines a capacitive element.

The particular arrangement of the elements of the capacitive element can provide several advantages. For instance, the capacitor of the present invention may be mounted onto a circuit board as a surface mount capacitor and may provide a smaller footprint on the circuit board. This may in turn also allow for a reduction in size of a circuit board.

Additionally, in certain applications, it is desirable to maintain as low an inductance (i.e., parasitic inductance) as possible. Employing the capacitor of the present invention allows for a substantial reduction in inductance. In particular, minimizing the distance or path for a ground connection can assist in reducing the inductance. In general, employing the capacitor of the present invention can allow for at least one order of magnitude reduction in inductance in comparison to employing a plurality of individual multilayer ceramic capacitors. For instance, employing the capacitor of the present invention may result in an inductance on the order of picohenries or even femtohenries in comparison to capacitors of the prior art which exhibit inductance of greater magnitudes. In general, the inductance may be less than 1 nanohenry. In particular, the inductance may be 900 picohenries or less, such as 750 picohenries or less, such as 500 picohenries or less, such as 400 picohenries or less, such as 250 picohenries or less, such as 100 picohenries or less, such as 50 picohenries or less, such as 25 picohenries or less, such as 15 picohenries or less, such as 10 picohenries or less. The inductance may be 1 femtohenry or more, such as 25 femtohenries or more, such as 50 femtohenries or more, such as 100 femtohenries or more, such as 250 femtohenries or more, such as 500 femtohenries or more, such as 750 femtohenries or more. Minimizing such inductance can contribute to good performance, in particular good decoupling performance, especially under high-speed transient conditions.

In addition, the capacitor may provide a desired capacitance. In particular, the capacitance may be 1,000 µF or less, such as 750 µF or less, such as 500 µF or less, such as 250 µF or less, such as 100 µF or less, such as 50 µF or less, such as 25 µF or less, such as 20 µF or less, such as 15 µF or less, such as 10 µF or less, such as 5 µF or less, such as 2.5 µF or less, such as 1 µF or less, such as 0.75 µF or less, such as 0.5 µF or less. The capacitance may be 1 µF or more, such as 10 µF or more, such as 25 µF or more, such as 50 µF or more, such as 100 µF or more, such as 250 µF or more, such as 500 µF or more, such as 750 µF or more, such as 900 µF or more, such as 1 µF or more, such as 2 µF or more, such as 3 µF or more, such as 5 µF or more, such as 8 µF or more, such as 10 µF or more. The capacitance may be measured using general techniques as known in the art.

Furthermore, the capacitor may provide a desired resistance. In particular, the resistance may be 100 mOhm or less, such as 75 mOhm or less, such as 50 mOhm or less, such as 40 mOhm or less, such as 30 mOhm or less, such as 25 mOhm or less, such as 20 mOhm or less, such as 15 mOhm or less, such as 10 mOhm or less, such as 5 mOhm or less. The resistance may be 0.01 mOhm or more, such as 0.1 mOhm or more, such as 0.25 mOhm or more, such as 0.5 mOhm or more, such as 1 mOhm or more, such as 1.5 mOhm or more, such as 2 mOhm or more, such as 5 mOhm or more, such as 10 mOhm or more. The resistance may be measured using general techniques as known in the art.

As indicated above, the present invention includes a multilayer capacitor that contains a plurality of capacitive elements within a single, unitary package. The capacitor includes a top surface and a bottom surface opposite the top surface. The capacitor also includes at least one side surface, in particular at least two side surfaces, that extend between the top surface and the bottom surface. The capacitor may include at least one end surface, in particular at least two end surfaces, that extend between the top surface and the bottom surface. In general, the side surfaces extend in the length (L) direction and have a generally longer dimension than the end surfaces which extend in the width (W) direction and have a generally shorter dimension. In one embodiment, the capacitor includes at least six total surfaces (e.g., one top, one bottom, two sides, and two ends). For instance, the capacitor may have a parallelepiped shape, such as a rectangular parallelepiped shape.

In addition, the capacitor may have a desired height. For instance, the height may be 10 microns or more, such as 25 microns or more, such as 50 microns or more, such as 100 microns or more, such as 200 microns or more, such as 250 microns or more, such as 300 microns or more, such as 350 microns or more, such as 400 microns or more, such as 450 microns or more, such as 500 microns or more, such as 1,000 microns or more, such as 2,000 microns or more. The height may be 5,000 microns or less, such as 4,000 microns or less, such as 2,500 microns or less, such as 2,000 microns or less, such as 1,000 microns or less, such as 750 microns or less, such as 600 microns or less, such as 500 microns or less, such as 450 microns or less. When surrounded by a ball grid array, the height of the capacitor may be within 10%, such as within 7%, such as within 5%, such as within 3%, such as within 2%, such as within 1% the height (or diameter) of the balls of the ball grid array. For instance, such height may be the original height prior to any reflow.

The capacitor may have a desired length. For instance, the length may be 10 microns or more, such as 25 microns or more, such as 50 microns or more, such as 100 microns or more, such as 200 microns or more, such as 250 microns or more, such as 300 microns or more, such as 350 microns or more, such as 400 microns or more, such as 450 microns or more, such as 500 microns or more, such as 1,000 microns or more, such as 1,500 microns or more, such as 2,000 microns or more, such as 2,500 microns or more, such as 3,000 microns or more, such as 3,500 microns or more, such as 4,000 microns or more. The length may be 10,000 microns or less, such as 8,000 microns or less, such as 6,000 microns or less, such as 5,000 microns or less, such as 4,000 microns or less, such as 3,000 microns or less, such as 2,500 microns or less, such as 2,000 microns or less, such as 1,000 microns or less, such as 750 microns or less, such as 600 microns or less, such as 500 microns or less, such as 450 microns or less.

The capacitor may also have a desired width. For instance, the width may be 10 microns or more, such as 25 microns or more, such as 50 microns or more, such as 100 microns or more, such as 200 microns or more, such as 250 microns or more, such as 300 microns or more, such as 350 microns or more, such as 400 microns or more, such as 450 microns or more, such as 500 microns or more, such as 750 microns or more, such as 1,000 microns or more, such as 1,500 microns or more, such as 2,000 microns or more, such as 2,500 microns or more, such as 3,000 microns or more. The width may be 5,000 microns or less, such as 4,000 microns or less, such as 3,000 microns or less, such as 2,500 microns or less, such as 2,000 microns or less, such as 1,500 microns or less, such as 1,000 microns or less, such as 750 microns or less, such as 600 microns or less, such as 500 microns or less, such as 450 microns or less.

In general, the multilayer capacitor contains a set of alternating dielectric layers and internal electrode layers. The capacitor also includes external terminals electrically connected to the internal electrode layers wherein the external terminals are formed on a top surface of the capacitor and a bottom surface of the capacitor opposing the top surface of the capacitor and at least two opposing end surfaces.

In general, the capacitor includes at least one set of alternating dielectric layers and internal electrode layers. The capacitor may also contain a second set of alternating dielectric layers and internal electrode layers. In this regard, the capacitor may include at least two, such as at least three, such as at least four sets of alternating dielectric layers and internal electrode layers. However, it should be understood that the present invention may include any number of sets of alternating dielectric layers and internal electrode layers and is not necessarily limited. In addition, the respective sets of alternating dielectric layers and internal electrode layers may be separated from an adjacent set by a certain distance. For instance, that distance is greater than the thickness of an individual dielectric layer in the set. In particular, the distance may be at least two, such as at least 3, such as at least 5, such as at least 10 times the thickness of a dielectric layer in the set.

The set(s) of alternating dielectric layers and internal electrode layers may form at least part of the main body of the capacitor. By arranging the dielectric layers and the internal electrode layers in a stacked or laminated configuration, the capacitor may be referred to as a multilayer capacitor and in particular a multilayer ceramic capacitor, for instance when the dielectric layers comprise a ceramic.

The set of alternating dielectric layers and internal electrode layers comprises dielectric layers alternately arranged with internal electrode layers. In particular, the internal electrode layers include first internal electrode layers and second internal electrode layers interleaved in an opposed and spaced apart relation with a dielectric layer located between each internal electrode layer.

In general, the thickness of the dielectric layers and internal electrode layers is not limited and can be any thickness as desired depending on the performance characteristics. For instance, the thickness of the internal electrode layers can be, but is not limited to, being about 500 nm or greater, such as about 1 μm or greater, such as about 2 μm or greater to about 10 μm or less, such as about 5 μm or less, such as about 4 μm or less, such as about 3 μm or less, such as about 2 μm or less. For instance, the internal electrode layers may have a thickness of from about 1 μm to about 2 μm.

In addition, the present invention is not necessarily limited by the number of internal electrode layers per set of alternating dielectric layers and internal electrode layers or in the entire capacitor. For instance, each set may include 10 or more, such as 25 or more, such as 50 or more, such as 100 or more, such as 200 or more, such as 300 or more, such as 500 or more, such as 600 or more, such as 750 or more, such as 1,000 or more internal electrode layers. Each set may have 5,000 or less, such as 4,000 or less, such as 3,000 or less, such as 2,000 or less, such as 1,500 or less, such as 1,000 or less, such as 750 or less, such as 500 or less, such as 400 or less, such as 300 or less, such as 250 or less, such as 200 or less, such as 175 or less, such as 150 or less internal electrode layers. Also, the entire capacitor may include the aforementioned number of electrode layers.

The internal electrode layers have a top edge and a bottom edge opposite the top edge. The internal electrode layers also have two side edges that extend between the top edge and the bottom edge. In one embodiment, the side edges, top edge, and bottom edge define a main body of the internal electrode layers. In general, the main body may have a rectangular configuration or shape.

In general, the top edge and the bottom edge may have the same dimension (e.g., length—L direction). The side edges may have the same dimension (e.g., height—T direction). In general, the side edges may have a dimension (e.g., height—T direction) that is shorter than a dimension (e.g., length—L direction) of the top edge and/or bottom edge. In this regard, the height of a side edge of the internal electrode layer as it extends between the top and bottom surfaces of the capacitor may be less than the length of the top edge and/or bottom edge of the internal electrode layers as it extends between end surfaces of the capacitor. In other words, the internal electrode layers may have a top edge and/or a bottom edge of greater dimension than the side edges of a lesser dimension. In this regard, the "short" sides of the layers may register with the height direction of the capacitor.

The internal electrode layers have lead tabs extending from a main body of the layer. The lead tabs extend from a top edge and a bottom edge. In other words, the internal electrode layers may have lead tabs extending from the "long" sides or edges of the layers. The lead tabs may extend to an edge of a dielectric layer and/or a surface of the capacitor. For instance, when in a stacked configuration, a leading edge of the lead tab may extend to an edge of a dielectric layer. Such leading edge may be used to form the external terminals. In addition, the edge may have at least one lead tab, such as at least two lead tabs, such as at least three lead tabs, such as at least four lead tabs extending therefrom.

Each top edge and bottom edge of the internal electrode layers may have an equal number of lead tabs extending therefrom. For instance, each edge may have at least one lead tab extending therefrom. In another embodiment, each edge may have at least two lead tabs extending therefrom. However, it should be understood that the present invention may include any number of lead tabs extending from the internal electrode layers and is not necessarily limited.

In one embodiment, at least one lead tab extends from top edge and a bottom edge of the main body of the internal electrode layer wherein the edge of the lead tab aligns with the side edge of the main body of the internal electrode layer. For instance, at least one lateral edge (i.e., edge registering in a height direction) of the lead tabs may be substantially aligned with the side edge of the main body of the internal electrode layer. In this regard, at least one lead tab may not be offset from the side edge of the internal electrode layer.

In addition, when more than lead tab may be present along an edge, the lab tab may extend from an inner portion of a top edge and a bottom edge of the main body of the internal electrode layer. In this regard, the lead tab may not extend immediately from a side edge of an internal electrode layer. In other words, the lead tab may be offset from a side edge of the internal electrode layer. The offset may be such that it is offset and positioned between the side edges of the internal electrode layer, in particular at a position that is at least 50% of the length of the internal electrode layer (e.g., past the center of the internal electrode layer).

The lead tabs extending from a top edge of a respective internal electrode layer and a bottom edge of the same internal electrode layer may be offset the same distance from a side edge. In this regard, at least one lateral edge (i.e., edge registering in a height direction) of the lead tabs may be substantially aligned. In one embodiment, both lateral edges of the respective lead tabs may be substantially aligned.

Similarly, the length (i.e., extending in the longitudinal direction from an end surface to another end surface) of a lead tab extending from the top edge may be the same as the length of a corresponding lead tab extending from the bottom edge.

The length of the lead tab may be 0.3 mm or more, such as 0.4 mm or more, such as 0.5 mm or more, such as 0.6 mm or more, such as 0.7 mm or more. The length of the lead tab may be 1.1 or less, such as 0.9 or less, such as 0.8 or less, such as 0.7 or less, such as 0.6 or less, such as 0.5 or less. When more than one lead tab is present along an edge, each lead tab may have the same length.

In another embodiment, each lead tab may have a different length. For instance, the lead tab substantially aligned with the side edge of the internal electrode layer may have a length greater than the lead tab offset from the side edges of the internal electrode layer. In this regard, the ratio of the length of the lead tab aligned with the side edge of the internal electrode layer to the length of the lead tab offset from the side edges of the internal electrode layer may be 0.3 or more, such as 0.5 or more, such as 0.7 or more, such as 0.9 or more, such as 1 or more, such as 1.1 or more, such as 1.2 or more, such as 1.3 or more, such as 1.4 or more, such as 1.5 or more. The ratio may be 5 or less, such as 4 or less, such as 3 or less, such as 2 or less, such as 1.8 or less, such as 1.7 or less, such as 1.6 or less, such as 1.5 or less, such as 1.4 or less.

By substantially aligned, it is meant that the offset from a side edge of one lateral edge of a first lead tab and/or second lead tab on a top edge is within +/−10%, such as within +/−5%, such as within +/−4%, such as within +/−3%, such as within +/−2%, such as within +/−1%, such as within +/−0.5% of the offset from a side edge of a corresponding lateral edge of a first lead tab and/or second lead tab on a bottom edge.

The distance between adjacent exposed lead tabs of the internal electrode layers in a given column may be specifically designed to ensure guided formation of terminations. Such distance between exposed lead tabs of the internal electrode layers in a given column may be about 10 microns or less, such as about 8 microns or less, such as about 5 microns or less, such as about 4 microns or less, such as about 2 microns or less, such as about 1.5 microns or less, such as about 1 micron or less. The distance may be about 0.25 microns or more, such as about 0.5 microns or more, such as about 1 micron or more, such as about 1.5 microns or more, such as about 2 microns or more, such as about 3 microns or more. However, it should be understood that such distance may not necessarily be limited.

Additionally, the distance between adjacent columnar stacks of electrode tabs may be, while not limited, greater by at least a factor of two than the distance between adjacent lead tabs in a given column to ensure that distinct terminations do not run together. In some embodiments, the distance between adjacent columnar stacks of exposed metallization is about four times the distance between adjacent exposed electrode tabs in a particular stack. However, such distance may vary depending on the desired capacitance performance and circuit board configuration.

The distance may be 0.1 mm or more, such as 0.2 mm or more, such as 0.3 mm or more, such as 0.4 mm or more, such as 0.5 mm or more, such as 0.6 mm or more. The distance may be 1.5 mm or less, such as 1.3 mm or less, such as 1 mm or less, such as 0.9 mm or less, such as 0.7 mm or less, such as 0.6 mm or less, such as 0.5 mm or less, such as 0.4 mm or less. Such distance may be determined based on the centerpoint of each lead tab in one embodiment. In another embodiment, such distance may be based on the distance between adjacent lateral edges of the lead tabs. In addition, such distance may correspond to the separation distance of the ball on a ball grid array.

A lead tab of a first internal electrode layer and a lead tab of a second internal electrode layer within a set of alternating dielectric layers and internal electrode layers are offset from each other in a longitudinal direction. That is, the lead tabs of respective internal electrode layers may be symmetrically offset a certain distance from a centerline (e.g., longitudinal centerline or about a vertical line) of the internal electrode layers and/or dielectric layer. That is, the lead tabs of respective internal electrode layers may be symmetrically offset about a vertical line of the internal electrode layers and/or dielectric layer. Regardless, a gap region is formed between the lead tabs of respective internal electrode layers.

In addition, the internal electrode layers, regardless of the number of lead tabs extending therefrom, may be symmetrical in a given direction. For instance, the lead tabs may be symmetrical about a horizontal line (i.e., a line extending from the center of one side edge to the center of the other side edge of the internal electrode layer) through the center of the main body of the internal electrode layer.

Furthermore, as indicated herein, each internal electrode layer includes at least two side edges. When stacked to form the body of the capacitor, such side edges of the alternating internal electrode layers may not be substantially aligned with one another. For instance, the side edges may be offset from one another.

As indicated herein, the capacitor includes a set of alternating dielectric layers and internal electrode layers. If the capacitor includes a second set of alternating dielectric layers and internal electrode layers, in one embodiment, the distance between the first internal electrode layer of one set and the last internal electrode layer of another set may be greater than the distance between adjacent internal electrode layers within a given set. For instance, the distance between the first internal electrode layer of a first set and the last internal electrode layer of a second set may be greater than the distance between the first internal electrode layer and the second internal electrode layer of the first set.

The capacitor of the present invention also includes external terminals on the top surface and the bottom surface. The capacitor also includes external terminals on opposing end surfaces. In one particular embodiment, the external terminals may not be present on a side surface of the capacitor.

The external terminals include at least one first polarity terminal and at least one second and opposite polarity terminal. The capacitors may include at least one, such as at least two, such as at least four, such as at least six, such as at least eight first polarity terminals and/or second and opposite polarity terminals on a top surface of the capacitor. Additionally, the capacitors may include the aforementioned amounts of terminals on a bottom surface of the capacitor.

The capacitors may include an equal number of first polarity terminals and/or second polarity terminals on the top surface of a capacitor and the bottom surface of a capacitor. The number of first polarity terminals may equal the number of second and opposite polarity terminals on a top surface of a capacitor. The number of first polarity terminals may equal the number of second and opposite polarity terminals on a bottom surface of a capacitor. The total number of terminals present on a top surface of the capacitor may equal to the total number of terminals present on a bottom surface of the capacitor. The total number of first polarity terminals present on a top surface and a bottom surface of the capacitor may equal the total number of second and opposite polarity terminals present on a top surface and a bottom surface of the capacitor.

In general, the like polarity terminals on the bottom surface of the capacitor that correspond to a particular set of alternating dielectric layers and internal electrode layers are electrically connected to the like polarity terminals on the top surface of the capacitor. The like polarity terminals located on a top surface and a bottom surface of a capacitor may not be interdigitated. In this regard, corresponding like polarity terminals on a top and a bottom surface may not be offset by a terminal position but may instead be positioned directly above or below another like polarity terminal on the opposite top or bottom surface. In other words, corresponding like polarity terminals that correspond to a particular set of alternating dielectric layers and internal electrode layers, and in particular corresponding lead tabs of such set, may be substantially aligned. By substantially aligned, it is meant that the offset from a side edge of one lateral edge of a polarity terminal on a top surface is within +/−10%, such as within +/−5%, such as within +/−4%, such as within +/−3%, such as within +/−2%, such as within +1-1%, such as within +/−0.5% of the offset from a side edge of a corresponding polarity terminal on a bottom surface.

In general, the pitch (i.e., nominal distance between the centers also referred to as center-to-center spacing) of the external terminals may be dictated by the particular circuit board configuration. The pitch between external terminals in one direction (i.e., x or y direction) may be the same as the pitch between adjacent external terminals in the other direction (i.e., y or x direction, respectively). That is, the pitch between any two adjacent external terminals may be substantially the same as the pitch between any other two adjacent external terminals.

The pitch may be about 0.1 mm or greater, such as about 0.2 mm or greater, such as about 0.3 mm or greater, such as 0.4 mm or greater, such as about 0.5 mm or greater, such as about 0.6 mm or greater, such as about 0.7 mm or greater, such as about 0.8 mm or greater, such as about 0.9 mm or greater, such as about 1.0 m or greater. The pitch may be about 2.0 mm or less, such as about 1.5 mm or less, such as about 1.4 mm or less, such as about 1.3 mm or less, such as about 1.2 mm or less, such as about 1.1 mm or less, such as about 1.0 mm or less. For instance, the pitch may be about 0.2 mm, about 0.4 mm, about 0.6 mm, about 0.8 mm, about 1.0 mm, about 1.2 mm, etc. In particular, the pitch may be 0.6 mm, 0.8 mm, or 1.0 mm. In one embodiment, the pitch may be about 0.6 mm, such as 0.6 mm+/−10%, such as +/−5%, such as +/−2%, such as +/−1%. In another embodiment, the pitch may be about 0.8 mm, such as 0.8 mm+/−10%, such as +/−5%, such as +/−2%, such as +/−1%. In a further embodiment, the pitch may be about 1 mm, such as 1 mm+/−10%, such as +/−5%, such as +/−2%, such as +/−1%.

As indicated above, the extension of a leading edge of a lead tab can assist in the formation of the external terminals. In this regard, the pitch between a lead tab on a first internal electrode layer and a lead tab on a second internal electrode layer may be the same as mentioned above. That is, the pitch between a lead tab on a first internal electrode layer and a lead tab on a second internal electrode layer may be substantially the same as the pitch between the corresponding external terminals for which the lead tabs are utilized in forming.

In addition, the external terminals may be positioned similar to the configuration of a ball-grid array. For instance, the external terminals may be provided to make contacts as typically employed by a ball-grid array, in particular a surrounding ball-grid array. In this regard, the pitch of the external terminals may be the same as the pitch of a surrounding ball-grid array. That is, the pitch may be within 10%, such as within 5%, such as within 2%, such as within 1%, such as within 0.5%, such as within 0.1% of the pitch of a surrounding ball-grid array.

In addition, like a ball-grid array, the external terminals may be provided in rows and columns. That is, the external terminals may be provided such that they exist in at least two rows and at least two columns. For instance, the external terminals may be presented in at least two rows, such as at least three rows, such as at least four rows. The number of rows can be dictated by the number of different sets of alternating dielectric layers and internal electrode layers. In addition, the external terminals may be presented in at least two columns, such as at least three columns, such as at least four columns. The number of columns can be dictated by the number of different columnar tabs of the internal electrodes.

Furthermore, the length (i.e., extending in the longitudinal direction from an end surface to another end surface) of an external terminal extending along the top surface may be the same as the length of a corresponding external terminal extending along the bottom surface.

The length of the external terminal may be 0.3 mm or more, such as 0.4 mm or more, such as 0.5 mm or more, such as 0.6 mm or more, such as 0.7 mm or more. The length of the external terminal may be 1.1 or less, such as 0.9 or less, such as 0.8 or less, such as 0.7 or less, such as 0.6 or less, such as 0.5 or less. When more than one external terminal is present along a surface, each external terminal may have the same length. Furthermore, the length of the external terminal may be less than the length of the capacitor, such as 50% or less, such as 40% or less, such as 30% or less, such as 25% or less, such as 20% or less, such as 15% or less the length of the capacitor.

In another embodiment, each external terminal may have a different length. For instance, the external terminal adjacent an end surface may have a length greater than the external terminal offset from the end surface. In this regard, the ratio of the length of the external terminal adjacent an end surface to the length of the external terminal offset from the end surface may be 0.3 or more, such as 0.5 or more, such as 0.7 or more, such as 0.9 or more, such as 1 or more, such as 1.1 or more, such as 1.2 or more, such as 1.3 or more, such as 1.4 or more, such as 1.5 or more. The ratio may be 5 or less, such as 4 or less, such as 3 or less, such as 2 or less, such as 1.8 or less, such as 1.7 or less, such as 1.6 or less, such as 1.5 or less, such as 1.4 or less.

Furthermore, the width of an external terminal extending from a side surface to an opposing side surface may be same on the top surface and the bottom surface. For instance, the width may be 0.3 mm or more, such as 0.4 mm or more, such as 0.5 mm or more, such as 0.6 mm or more, such as 0.7 mm or more. The width of the external terminal may be 1.1 or less, such as 0.9 or less, such as 0.8 or less, such as 0.7 or less, such as 0.6 or less, such as 0.5 or less. When more than one external terminal is present along a surface, each external terminal may have the same width. Furthermore, the width of the external terminal may be less than the width of the capacitor.

The capacitor of the present invention can be further described according to the embodiments as illustrated in FIGS. 1A-1B and 2A-2B.

FIG. 1A illustrates a capacitor 10 in a 1 by 2 configuration. That is, the capacitor includes two terminals along one dimension of the top surface and the bottom surface. In addition, the capacitor includes terminals along an end surface such that they wrap around from the top surface to the bottom surface along the adjacent end surface. In this regard, the capacitor 10 includes a total of two external terminals 12, 14 on a top surface and two corresponding external terminals (not shown) on a bottom surface wherein the external terminals on the top surface are electrically connected to the corresponding external terminals on the bottom surface.

Figure 1B:
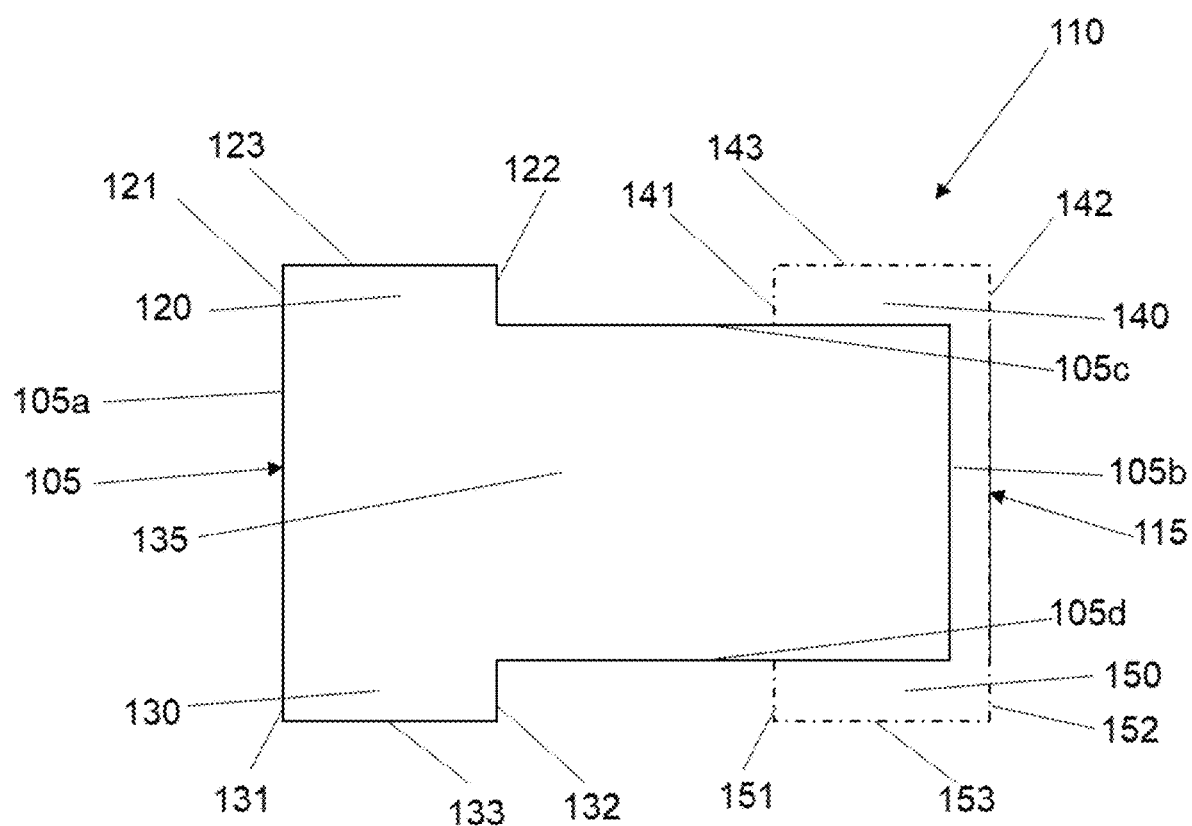
FIG. 1B illustrates a top external perspective view of the internal electrode layers of the capacitor of FIG. 1A.

The capacitor 10 of FIG. 1A includes external terminals 12, 14 and a set of alternating dielectric layers and internal electrode layers 110, as illustrated in FIG. 1D. As illustrated in FIG. 1B, the set of alternating dielectric layers and internal electrode layers 110 includes internal electrode layers 105, 115 and dielectric layers (not shown) in an alternate arrangement.

In general, the internal electrode layers 105, 115 include at least one lead tab 120, 130, 140, 150 extending from a top edge and a bottom edge of the main body of the internal electrode layers. In general, the lead tabs 120, 130, 140, 150 of the internal electrode layers 105, 115 extend to the top surface and the bottom surface of the capacitor and assist in forming the external terminals. In this regard, the lead tabs 120, 130, 140, 150 may be exposed on the top surface and the bottom surface of the capacitor and allow for connection between the main body of the internal electrode layers and the external terminals. For instance, lead tabs 120, 130, 140, 150 may contain leading edges 123, 133, 143, 153 that extend to an edge of a dielectric layer and allow for formation of the external terminals.

As illustrated in FIG. 1B, a first internal electrode layer 105 includes one lead tab 120, 130 along a top edge 105c and a bottom edge 105d and extending from main body 135.

A second internal electrode layer 115 includes one lead tab 140, 150 along a top edge and a bottom edge and extending from main body 145.

The lead tabs 120, 130 on the top edge and the bottom edge of first internal electrode layer 105 may be aligned in the vertical direction. That is, a lateral edge 121, 122 of a first lead tab 120 along a top edge 105c may be aligned with a lateral edge 131, 132 of a first lead tab 130 along a bottom edge 105d opposite the top edge 105c. In addition, such lateral edges 121, 131 may be aligned with the side edge 105a of the internal electrode layer 105.

However, it should be understood that both lateral edges 121, 122 of the first lead tab 120 along a top edge 105c may be aligned with the lateral edges 131, 132 of a first lead tab 130 along a bottom edge 105d opposite the top edge 105c. In other words, both lateral edges 122, 132 may be aligned and offset from the side edges 105a-b the same distance along a bottom edge 105d and the top edge 105c.

Similarly, the lead tabs 140, 150 on the top edge and the bottom edge of second internal electrode layer 115 may be aligned in the vertical direction. That is, a lateral edge 141, 142 of a first lead tab 140 along a top edge may be aligned with a lateral edge 151, 152 of a first lead tab 150 along a bottom edge opposite the top edge. In one embodiment, both lateral edges 141, 142 of the first lead tab 140 along a top edge may be aligned with the lateral edges 151, 152 of a first lead tab 150 along a bottom edge opposite the top edge. The relationship between lateral edges of a first lead tab on a top edge and a first lead tab on a bottom edge as mentioned with respect to internal electrode layer 105 may also apply to internal electrode layer 115.

With such arrangement a gap may be formed between lead tab 120 of the first internal electrode layer 105 and lead tab 140 of the second internal electrode layer 115. Similarly, a gap may be formed between lead tab 130 of the first internal electrode layer 105 and lead tab 150 of the second internal electrode layer 115. The size of each respective gap may be substantially the same.

The lead tabs 120 and 140 may be arranged in parallel with lead tabs 130 and 150, respectively, extending from the internal electrode layers 105 and 115 such that the lead tabs extending from alternating electrode layers 105 and 115 may be aligned in a respective column. For instance, lead tabs 120 and 130 of internal electrode layer 105 may be arranged in a respective stacked configuration while lead tabs 140 and 150 of internal electrode layer 115 may be arranged in a respective stacked configuration.

It will be appreciated that lead tabs 120 connect to external terminal 12 while lead tabs 140 connect to external terminal 14. Accordingly, respective lead tabs 120 will be interdigitated with respective lead tabs 140 in a manner similar to external terminals 12 and 14. The interdigitated lead tabs can provide multiple, adjacent current injection points onto the associated main electrode portions.

Additionally, capacitor 10 of FIG. 1A includes at least one first polarity terminal and at least one second and opposite polarity terminal on a top surface. Although not shown, the bottom surface includes at least a first polarity terminal and a second and opposite terminal. Also not shown, the first polarity terminal 12 extends along the end surface to the bottom surface.

As illustrated in FIGS. 1A-1B, the capacitor contains two external terminals on each surface and each internal electrode layer contains at least one lead tab extending from a top edge and a bottom edge. However, as indicated above, the present invention is not limited by the number of external terminals and/or the number of lead tabs extending from a top edge and/or bottom edge.

Figure 2A:
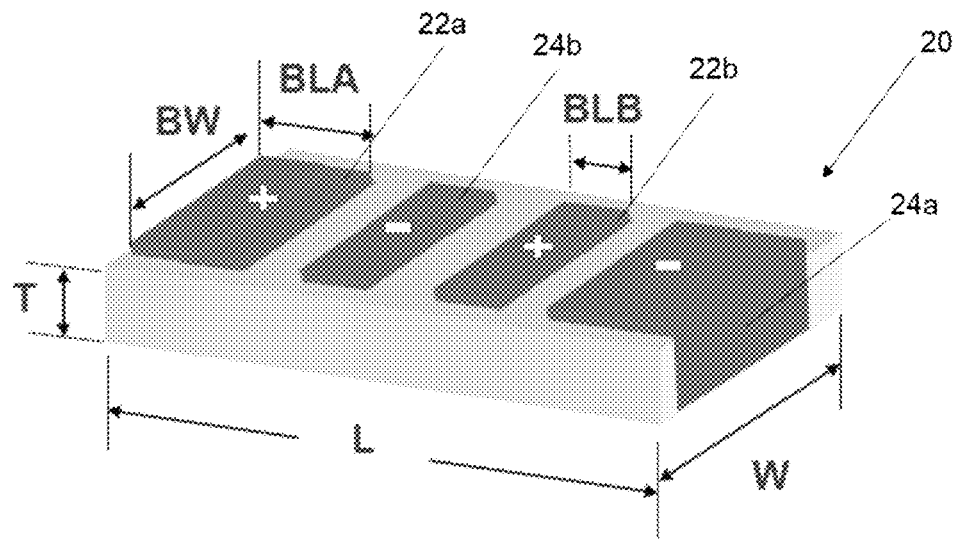
FIG. 2A illustrates a generally top and sides external perspective view of another embodiment of a capacitor including four external terminals in accordance with the present invention.

For instance, FIG. 2A illustrates a capacitor 20 containing four external terminals on each surface and two lead tabs extending from the top surface and the bottom surface of each internal electrode layers.

As illustrated in FIG. 2A, the capacitor 20 has a 1 by 4 configuration. That is, the capacitor includes four terminals along one dimension of the top surface and the bottom surface. In this regard, the capacitor includes a total of four external terminals 22a-b, 24a-b on a top surface and four corresponding external terminals (not shown) on a bottom surface wherein the external terminals on the top surface are electrically connected to the corresponding external terminals 22a-b, 24a-b on the bottom surface. In addition, the external terminals 22a, 24a extend along the adjacent end surface from the top surface to the bottom surface.

Figure 2B:
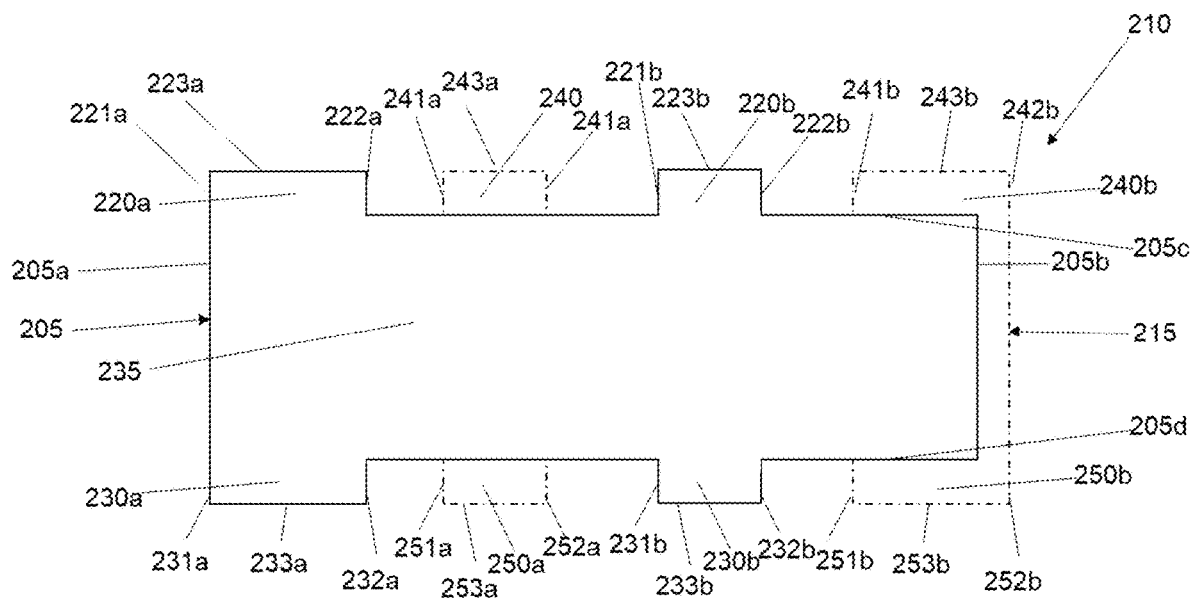
FIG. 2B illustrates a top external perspective view of the internal electrode layers of the capacitor of FIG. 2A.

The capacitor 20 of FIG. 2A includes external terminals 22a-b, 24a-b and a set of alternating dielectric layers and internal electrode layers 210 as illustrated in FIG. 2B. As illustrated in FIG. 2B, the set of alternating dielectric layers and internal electrode layers 210 includes internal electrode layers 205, 215 and dielectric layers (not shown) in an alternate arrangement.

In general, the internal electrode layers 205, 215 include at least one lead tab 220a-b, 230a-b, 240a-b, 250a-b extending from a top edge and a bottom edge of the main body of the internal electrode layers. In general, the lead tabs 220a-b, 230a-b, 240a-b, 250a-b of the internal electrode layers 205, 215 extend to the top surface and the bottom surface of the capacitor and assist in forming the external terminals. In this regard, the lead tabs 220a-b, 230a-b, 240a-b, 250a-b may be exposed on the top surface and the bottom surface of the capacitor and allow for connection between the main body of the internal electrode layers and the external terminals. For instance, lead tabs 220a-b, 230a-b, 240a-b, 250a-b may contain leading edges 223a-b, 233a-b, 243a-b, 253a-b that extend to an edge of a dielectric layer and allows for formation of the external terminals.

As illustrated in FIG. 2B, the internal electrode layers 205, 215 include at least two lead tabs 220a-b, 230a-b, 240a-b, 250a-b along a top edge and a bottom edge. As illustrated in FIG. 2B, a first internal electrode layer 205 includes two lead tabs 220a-b, 230a-b along each top edge 205c and bottom edge 205d and extending from main body 235. A second internal electrode layer 215 includes two lead tabs 240a-b, 250a-b along each top edge bottom edge and extending from main body 245.

The lead tabs 220a-b, 230a-b on the top edge 205c and the bottom edge 205d of first internal electrode layer 205 may be aligned in the vertical direction. That is, a lateral edge 221a, 222a of a first lead tab 220 along a top edge 205c may be aligned with a lateral edge 231a, 232a of a first lead tab 230 along a bottom edge 205d opposite the top edge 205c. In addition, such lateral edges 221a, 231a may be aligned with the side edge 205a of the internal electrode layer 205.

However, it should be understood that both lateral edges 221a, 222a of the first lead tab 220a along a top edge 205c may be aligned with the lateral edges 231a, 232a of a first lead tab 230a along a bottom edge 205d opposite the top edge 205c. In other words, both lateral edges 222a, 232a may be offset from the side edges 205a-b the same distance along a bottom edge 205d and the top edge 205c.

When a top edge 205c and a bottom edge 205d contain at least two lead tabs 220a-b, 230a-b, at least one lateral edge of each lead tab on a top edge 205c may be aligned with a corresponding lateral edge of a lead tab on the bottom edge 205d. Also, both lateral edges of each lead tab on a top edge 205c may be aligned with corresponding lateral edges of the lead tabs on the bottom edge 205d.

Similarly, the lead tabs 240a-b, 250a-b on the top edge and the bottom edge of second internal electrode layer 215 may be aligned in the vertical direction. That is, a lateral edge 241a, 242a of a first lead tab 240 along a top edge may be aligned with a lateral edge 251a, 252a of a first lead tab 250 along a bottom edge opposite the top edge. Both lateral edges 241a, 242a of the first lead tab 240 along a top edge may be aligned with the lateral edges 251a, 252a of a first lead tab 250 along a bottom edge opposite the top edge. The relationship between lateral edges of a first lead tab on a top edge and a first lead tab on a bottom edge as mentioned with respect to internal electrode layer 205 may also apply to internal electrode layer 215.

With such arrangement, a gap may be formed between any of the lead tabs along a top edge 205c of first internal electrode layer 205, of second internal electrode layer 215, or both. For instance, a gap may be formed between any of lead tabs 220a-b, 240a-b that extend from the top edges of the respective internal electrode layers. Additionally, a gap may be formed between any of the lead tabs along a top edge 205d of first internal electrode layer 205, of second internal electrode layer 215, or both. For instance, a gap may be formed between any of lead tabs 230a-b, 250a-b that extend from the top edges of the respective internal electrode layers. Also, the size of a gap between two respective tabs that extend from a top edge, whether from the same internal electrode layer or adjacent internal electrode layers, may be substantially the same as the size of a gap between the corresponding two respective tabs that extend from a bottom edge. For example, the gap between lead tabs 220a and 220b may be substantially the same as the gap between lead tabs 230a and 230b. Similarly, the gap between lead tabs 220a and 240a may be substantially the same as the gap between lead tabs 230 and 250a.

Any or all of lead tabs 220a-b, 240a-b may be arranged in parallel with lead tabs 230a-b, 250a-b, respectively, extending from the layers 205 and 215 such that the lead extending from alternating electrode layers 205 and 215 may be aligned in a respective column. For instance, lead tabs 220a-b and 230a-b of internal electrode layer 205 may be arranged in a respective stacked configuration while lead tabs 240a-b and 250a-b of internal electrode layer 215 may be arranged in a respective stacked configuration.

It will be appreciated that lead tabs 220a-b connect to external terminals 22a-b, respectively, while lead tabs 240a-b connect to external terminal 24a-b, respectively. Accordingly, respective lead tabs 220a-b will be interdigitated with respective lead tabs 240a-b, respectively, in a manner similar to external terminals 22a-b and 24a-b. The interdigitated lead tabs can provide multiple, adjacent current injection points onto the associated main electrode portions.

Additionally, capacitor 20 of FIG. 2A includes at least one first polarity terminal and at least one second and opposite polarity terminal on a top surface. Although not shown, the bottom surface includes at least a first polarity terminal and a second and opposite terminal. In particular, FIG. 2A includes two positive terminals 22a-b and two negative terminals 24a-b on a top surface.

As illustrated in FIGS. 2A-2B, the capacitor contains four external terminals on each surface and the capacitor contains two sets of alternating dielectric layers and internal electrode layers. However, as indicated above, the present invention is not limited by the number of external terminals and/or the number of sets of alternating dielectric layers and internal electrode layers.

Additionally, the embodiments of the figures employ only two internal electrode layers per set of alternating dielectric layers and internal electrode layers. However, it should be understood that the present invention may include any number of internal electrode layers per set as indicated herein and is not necessarily limited.

In general, the present invention provides a capacitor having a unique configuration that provides various benefits and advantages. In this regard, it should be understood that the materials employed in constructing the capacitor may not be limited and may be any as generally employed in the art and formed using any method generally employed in the art.

In general, the dielectric layers are typically formed from a material having a relatively high dielectric constant (K), such as from about 10 to about 40,000 in some embodiments from about 50 to about 30,000, and in some embodiments, from about 100 to about 20,000.

In this regard, the dielectric material may be a ceramic. The ceramic may be provided in a variety of forms, such as a wafer (e.g., pre-fired) or a dielectric material that is co-fired within the device itself.

Particular examples of the type of high dielectric material include, for instance, NPO (COG) (up to about 100), X7R (from about 3,000 to about 7,000), X7S, ZSU, and/or Y5V materials. It should be appreciated that the aforementioned materials are described by their industry-accepted definitions, some of which are standard classifications established by the Electronic Industries Alliance (EIA), and as such should be recognized by one of ordinary skill in the art. For instance, such material may include a ceramic. Such materials may include a pervoskite, such as barium titanate and related solid solutions (e.g., barium-strontium titanate, barium calcium titanate, barium zirconate titanate, barium strontium zirconate titanate, barium calcium zirconate titanate, etc.), lead titanate and related solid solutions (e.g., lead zirconate titanate, lead lanthanum zirconate titanate), sodium bismuth titanate, and so forth. In one particular embodiment, for instance, barium strontium titanate ("BSTO") of the formula $Ba_xSr_{1-x}TiO_3$ may be employed, wherein x is from 0 to 1, in some embodiments from about 0.15 to about 0.65, and in some embodiments, from about 0.25 to about 0.6. Other suitable perovskites may include, for instance, $Ba_xCa_{1-x}TiO_3$ where x is from about 0.2 to about 0.8, and in some embodiments, from about 0.4 to about 0.6, $Pb_xZr_{1-x}TiO_3$ ("PZT") where x ranges from about 0.05 to about 0.4, lead lanthanum zirconium titanate ("PLZT"), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5KHb_2PO_4$. Still additional complex perovskites may include $A[B1_{1/3}B2_{2/3}]O_3$ materials, where A is $Ba_xSr_{1-x}$ (x can be a value from 0 to 1); B1 is $Mg_yZn_{1-y}$ (y can be a value from 0 to 1); B2 is $Ta_zNb_{1-z}$ (z can be a value from 0 to 1). In one particular embodiment, the dielectric layers may comprise a titanate.

The internal electrode layers may be formed from any of a variety of different metals as is known in the art. The internal electrode layers may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. Sputtered titanium/tungsten (Ti/W) alloys, as well as respective sputtered layers of chrome, nickel and gold, may also be suitable. In one particular embodiment, the internal electrode layers may comprise nickel or an alloy thereof.

External terminals may be formed from any of a variety of different metals as is known in the art. The external terminals may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. In one particular embodiment, the external terminals may comprise copper or an alloy thereof.

The external terminals can be formed using any method generally known in the art. The external terminals may be formed using techniques such as sputtering, painting, printing, electroless plating or fine copper termination (FCT), electroplating, plasma deposition, propellant spray/air brushing, and so forth.

The external terminals may be formed such that the external terminal is a thin-film plating of a metal. Such thin-film plating can be formed by depositing a conductive material, such as a conductive metal, on an exposed portion of an internal electrode layer. For instance, a leading edge of an internal electrode layer may be exposed such that it may allow for the formation of a plated termination.

The external terminals may have an average thickness of about 50 µm or less, such as about 40 µm or less, such as about 30 µm or less, such as about 25 µm or less, such as about 20 µm or less to about 5 µm or more, such as about 10 µm or more, such as about 15 µm or more. For instance, the external terminals may have an average thickness of from about 5 µm to about 50 µm, such as from about 10 µm to about 40 µm, such as from about 15 µm to about 30 µm, such as from about 15 µm to about 25 µm.

In general, the external terminal may comprise a plated terminal. For instance, the external terminal may comprise an electroplated terminal, an electroless plated terminal, or a combination thereof. For instance, an electroplated terminal may be formed via electrolytic plating. An electroless plated terminal may be formed via electroless plating.

When multiple layers constitute the external terminal, the external terminal may include an electroplated terminal and an electroless plated terminal. For instance, electroless plating may first be employed to deposit an initial layer of material. The plating technique may then be switched to an electrochemical plating system which may allow for a faster buildup of material.

When forming the plated terminals with either plating method, a leading edge of the lead tabs of the internal electrode layers that is exposed from the main body of the capacitor is subjected to a plating solution. By subjecting, in one embodiment, the capacitor may be dipped into the plating solution.

The plating solution contains a conductive material, such as a conductive metal, is employed to form the plated termination. Such conductive material may be any of the aforementioned materials or any as generally known in the art. For instance, the plating solution may be a nickel sulfamate bath solution or other nickel solution such that the plated layer and external terminal comprise nickel. Alternatively, the plating solution may be a copper acid bath or other suitable copper solution such that the plated layer and external terminal comprise copper.

Additionally, it should be understood that the plating solution may comprise other additives as generally known in the art. For instance, the additives may include other organic additives and media that can assist in the plating process. Additionally, additives may be employed in order to employ the plating solution at a desired pH. In one embodiment, resistance-reducing additives may be employed in the solutions to assist with complete plating coverage and bonding of the plating materials to the capacitor and exposed leading edges of the lead tabs of the internal electrode layers.

The capacitor may be exposed, submersed, or dipped in the plating solution for a predetermined amount of time. Such exposure time is not necessarily limited but may be for a sufficient amount of time to allow for enough plating material to deposit in order to form the plated terminal. In this regard, the time should be sufficient for allowing the formation of a continuous connection among the desired exposed, adjacent leading edges of lead tabs of a given polarity of the respective internal electrode layers within a set of alternating dielectric layers and internal electrode layers.

In general, the difference between electrolytic plating and electroless plating is that electrolytic plating employs an electrical bias, such as by using an external power supply. The electrolytic plating solution may be subjected typically to a high current density range, for example, ten to fifteen amp/ft$^2$(rated at 9.4 volts). A connection may be formed with a negative connection to the capacitor requiring formation of the plated terminals and a positive connection to a solid material (e.g., Cu in Cu plating solution) in the same plating solution. That is, the capacitor is biased to a polarity opposite that of the plating solution. Using such method, the conductive material of the plating solution is attracted to the metal of the exposed leading edge of the lead tabs of the internal electrode layers.

Prior to submersing or subjecting the capacitor to a plating solution, various pretreatment steps may be employed. Such steps may be conducted for a variety of purposes, including to catalyze, to accelerate, and/or to improve the adhesion of the plating materials to the leading edges of the lead tabs.

Additionally, prior to plating or any other pretreatment steps, an initial cleaning step may be employed. Such step may be employed to remove any oxide buildup that forms on the exposed lead tabs of the internal electrode layers. This cleaning step may be particularly helpful to assist in removing any buildup of nickel oxide when the internal electrodes or other conductive elements are formed of nickel. Component cleaning may be effected by full immersion in a preclean bath, such as one including an acid cleaner. In one embodiment, exposure may be for a predetermined time, such as on the order of about 10 minutes. Cleaning may also alternatively be effected by chemical polishing or harperizing steps.

In addition, a step to activate the exposed metallic leading edges of the lead tabs of the internal electrode layers may be performed to facilitate depositing of the conductive materials. Activation can be achieved by immersion in palladium salts, photo patterned palladium organometallic precursors (via mask or laser), screen printed or ink-jet deposited palladium compounds or electrophoretic palladium deposition. It should be appreciated that palladium-based activation is presently disclosed merely as an example of activation solutions that often work well with activation for exposed tab portions formed of nickel or an alloy thereof. However, it should be understood that other activation solutions may also be utilized and thus are not necessarily limited.

Also, in lieu of or in addition to the aforementioned activation step, the activation dopant may be introduced into the conductive material when forming the internal electrode layers of the capacitor. For instance, when the internal electrode layer comprises nickel and the activation dopant comprises palladium, the palladium dopant may be introduced into the nickel ink or composition that forms the internal electrode layers. Doing so may eliminate the palladium activation step. It should be further appreciated that some of the above activation methods, such as organometallic precursors, also lend themselves to co-deposition of glass formers for increased adhesion to the generally ceramic body of the capacitor. When activation steps are taken as described above, traces of the activator material may often remain at the exposed conductive portions before and after termination plating.

Additionally, post-treatment steps after plating may also be employed as desired or necessary. Such steps may be conducted for a variety of purposes, including enhancing and/or improving adhesion of the materials. For instance, a heating (or annealing) step may be employed after performing the plating step. Such heating may be conducted via baking, laser subjection, UV exposure, microwave exposure, arc welding, etc.

As indicated herein, the external terminal comprises at least one plating layer. In one embodiment, the external terminal may comprise only one plating layer. However, it should be understood that the external terminals may comprise a plurality of plating layers. For instance, the external terminals may comprise a first plating layer and a second plating layer. In addition, the external terminals may also comprise a third plating layer. Furthermore, the materials of these plating layers may be any of the aforementioned and as generally known in the art.

For instance, one plating layer, such as a first plating layer, may comprise copper or an alloy thereof. Another plating layer, such as a second plating layer, may comprise nickel or an alloy thereof. Alternatively, another plating layer, such as the second plating layer, may comprise cooper or an alloy thereof. Another plating layer, such as a third plating layer, may comprise tin, lead, gold, or a combination, such as an alloy. Alternatively, an initial plating layer may include nickel, following by plating layers of tin or gold. In another embodiment, an initial plating layer of copper may be formed and then a nickel layer.

In one embodiment, initial or first plating layer may be a conductive metal (e.g., copper). This area may then be covered with a second layer containing a resistor-polymeric material for sealing. The area may then be polished to selectively remove resistive polymeric material and then plated again with a third layer containing a conductive, metallic material (e.g., copper).

The aforementioned second layer above the initial plating layer may correspond to a solder barrier layer, for example a nickel-solder barrier layer. In some embodiments, the aforementioned layer may be formed by electroplating an additional layer of metal (e.g., nickel or copper) on top of an initial electrolessly or electrolytically plated layer (e.g., plated copper). Other exemplary materials for layer the aforementioned solder barrier layer include nickel-phosphorus, gold, and silver. A third layer on the aforementioned solder-barrier layer may in some embodiments correspond to a conductive layer, such as plated Ni, Ni/Cr, Ag, Pd, Sn, Pb/Sn or other suitable plated solder.

In addition, a layer of metallic plating may be formed followed by an electroplating step to provide a resistive alloy or a higher resistance metal alloy coating, for example, electroless Ni—P alloy over such metallic plating. It should be understood, however, that it is possible to include any metal coating as those of ordinary skill in the art will understand from the complete disclosure herewith.

It should be appreciated that any of the aforementioned steps can occur as a bulk process, such as barrel plating, fluidized bed plating and/or flow-through plating termination processes, all of which are generally known in the art. Such bulk processes enable multiple components to be processed at once, providing an efficient and expeditious termination process. This is a particular advantage relative to conventional termination methods, such as the printing of thick-film terminations that require individual component processing.

As described herein, the formation of the external terminals is generally guided by the position of the exposed leading edges of the lead tabs of the internal electrode layers. Such phenomena may be referred to as "self-determining" because the formation of the external plated terminals is determined by the configuration of the exposed conductive metal of the internal electrode layers at the selected peripheral locations on the capacitor.

Additional aspects of the above-described technology for forming thin-film plated terminations are described in U.S. Pat. No. 7,177,137 to Ritter et al. and U.S. Pat. No. 7,463,474 to Ritter et al., which are incorporated by reference herein for all purposes. It should be appreciated that additional technologies for forming capacitor terminals may also be within the scope of the present technology. Exemplary alternatives include, but are not limited to, the formation of terminations by plating, magnetism, masking, electrophoretics/electrostatics, sputtering, vacuum deposition, printing or other techniques for forming both thick-film conductive layers or thin-film conductive layers.

Furthermore, the capacitor may then be subjected to a solder mask. For instance, this can allow the capacitor to be coated. Without intending to be limited, such mask may assist in prevention of oxidation of the plated layers, such as the copper plated layer, in particular when such layer is the final plating layer of the external terminal. Such solder mask material may not necessarily limited by the present invention. For instance, such material may include any of those mentioned above with respect to the solder barrier layer. In addition or alternatively, such material may include an epoxy, such as a liquid epoxy which is then cured.

When providing such material on the capacitor, it may be required to access the plating layer and external terminal in order to form an electrical connection. In this regard, a laser may be utilized to form a hole through the mask layer. Such hole may then be filled with a conductive material, such as copper. This can then be utilized to form an electrical connection with the capacitor.

The capacitor as disclosed herein can be mounted using various means. For instance, the capacitor can be mounted onto a circuit board that contains a substrate (e.g., insulating layer) having an upper surface and a lower surface. The circuit board has a plurality of electrical current paths defined therein. The external terminals of the capacitor are in respective electrical communication with the predetermined current paths of the circuit board. In addition, the external terminals of the capacitor can be physically connected to the circuit board using any method generally known in the art, such as general soldering techniques.

In addition, an integrated circuit package may also be provided on the circuit board. The integrated circuit package may be connected to the circuit board using a ball grid array. The circuit board may further comprise a processor. The processor may be connected to the integrated circuit package also using a ball grid array.

In general, the ball grid array may be configured such that the pitch is 1.5 mm or less, such as 1.25 mm or less, such as 1 mm or less, such as 0.8 mm or less, such as 0.6 mm or less and 0.4 mm or more, such as 0.5 mm or more, such as 0.6 mm or more.

In addition, the integrated circuit package may also be connected to the circuit board using a capacitor as defined herein. In this regard, the internal electrode layers of the capacitor may be positioned such that they are orthogonal to a horizontal plane of the circuit board and integrated circuit package. In other words, the internal electrode layers of the capacitor may be positioned such that they are substantially nonparallel with the circuit board. For instance, the capacitor may be positioned between the integrated circuit package and the circuit board such that the capacitor is "sandwiched" between the two components. In this regard, the capacitor is directly connected to the integrated circuit package and the circuit board. For instance, the capacitor can be connected (e.g., physically and/or electrically) to the circuit board and/or circuit package using any method generally known in the art, such as general soldering techniques.

By employing the capacitor in the aforementioned arrangement, the capacitor may allow for removal of some of the original ball grid array. However, the capacitor may still be surrounded by a ball grid array.

In addition to the above, although not illustrated herein, in one embodiment, the integrated circuit package itself may include the multilayer capacitor. In this regard, the capacitor may be embedded directly into the package. Such incorporation of the capacitor may allow for a reduction in size, which can be beneficial for various electronic applications.

While the aforementioned provides one example of a means for mounting the capacitor as disclosed herein, it should be understood that other methods may also be utilized. For instance, the capacitor may be mounted via land grid array configuration. The capacitor may also be embedded in another substrate or component.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

The invention claimed is:

1. A multilayer capacitor comprising:
    a main body containing a set of alternating dielectric layers and internal electrode layers, the set containing a first internal electrode layer and a second internal electrode layer,
    the first internal electrode layer including:
        a main body having a top edge, a bottom edge opposite the top edge, a first side edge, and a second side edge opposite the first side edge along a length direction, the first side edge and the second side edge extending between the top edge and the bottom edge, and
        a first lead tab and a second lead tab extending from the top edge of the main body, and a first lead tab and a second lead tab extending from the bottom edge of the main body, wherein each of the first lead tab extending from the top edge of the main body and the first lead tab extending from the bottom edge of the main body includes a first lateral edge aligned with the first side edge of the main body, and
    the second internal electrode layer including:
        a main body having a top edge, a bottom edge opposite the top edge, a first side edge, and a second side edge opposite the first side edge along the length direction, the first side edge and the second side edge extending between the top edge and the bottom edge,
        a first lead tab and a second lead tab extending from the top edge of the main body and a first lead tab and a second lead tab extending from the bottom edge of the main body, wherein each of the first lead tab extending from the top edge of the main body and the first lead tab extending from the bottom edge of the main body includes a first lateral edge aligned with the first side edge of the main body, wherein the first side edge of the first internal electrode layer is opposite the first side edge of the second internal electrode layer along the length direction; and
    external terminals electrically connected to the internal electrode layers, the external terminals formed on a top surface of the capacitor, a bottom surface of the capacitor opposing the top surface of the capacitor, and a pair of opposing end surfaces of the capacitor extending along a width direction between the top surface and the bottom surface,
    wherein the external terminals include a first external terminal electrically connected to the first internal electrode layer along the top surface, the bottom surface, and a first end surface of the pair of opposing end surfaces, and
    wherein the external terminals include a second external terminal electrically connected to the second internal electrode layer along the top surface, the bottom surface, and a second end surface of the pair of opposing end surfaces.

2. The capacitor according to claim 1, wherein the first internal electrode layer and the second internal electrode layer are interleaved in an opposed relation and a dielectric layer is positioned between the first internal electrode layer and the second internal electrode layer.

3. The capacitor according to claim 2, wherein the dielectric layers comprise a ceramic.

4. The capacitor according to claim 1, wherein the internal electrode layers comprise a conductive metal.

5. The capacitor according to claim 1, wherein the external terminals include an electroplated layer.

6. The capacitor according to claim 1, wherein the external terminals include an electroless plated layer.

7. The capacitor according to claim 1, wherein the external terminals include an electroless plated layer and an electroplated layer.

8. The capacitor according to claim 1, wherein the external terminals include a first electroless plated layer, a second electroplated layer, and a third electroplated layer.

9. The capacitor according to claim 8, wherein the first electroless plated layer includes copper, the second electroplated layer includes nickel, and the third electroplated layer includes tin.

10. The capacitor according to claim 1, wherein the capacitor includes at least three sets of alternating dielectric layers and internal electrode layers.

11. A circuit board including the capacitor according to claim 1 positioned on the circuit board.

12. The circuit board according to claim 11, wherein the circuit board further comprises an integrated circuit package and wherein the capacitor is positioned between the circuit board and the integrated circuit package in a vertical direction such that the circuit board, the capacitor, and the integrated circuit package are present in a stacked arrangement.

13. The circuit board according to claim 12, wherein the capacitor is directly connected to the circuit board and the integrated circuit package.

14. An integrated circuit package containing the capacitor according to claim 1.

15. The capacitor according to claim 1, wherein each of the second lead tab extending from the top edge of the main body of the first internal electrode layer and the second lead tab extending from the bottom edge of the main body of the first internal electrode layer are offset from and positioned between the first side edge and the second side edge of the first internal electrode layer, and wherein each of the second lead tab extending from the top edge of the main body of the second internal electrode layer and the second lead tab extending from the bottom edge of the main body of the second internal electrode layer are offset from and positioned between the first side edge and the second side edge of the second internal electrode layer.

16. The capacitor according to claim 1, wherein, along the length direction, the first lead tab and the second lead tab extending from the top edge of the main body of the first internal electrode layer are offset from one another and from each of the first lead tab and the second lead tab extending from the top edge of the main body of the second internal electrode layer.

17. The capacitor according to claim 1, wherein the capacitor includes a pair of opposing side surfaces extending between the top surface and the bottom surface along a height direction and extending between the pair of opposing end surfaces in the length direction, the pair of opposing side surfaces including a first side surface and a second side surface, wherein the first external terminal is offset from both the first side surface and the second side surface along the width direction, and wherein the second external terminal is offset from both the first side surface and the second side surface along the width direction.

18. The capacitor according to claim 1, wherein the external terminals include a third external terminal electrically connected to the first internal electrode layer along the top surface of the capacitor and a fourth external terminal electrically connected to the first internal electrode layer along the bottom surface of the capacitor.

19. The capacitor according to claim 18, wherein the first external terminal is electrically connected to the first internal electrode layer along the first lead tab extending from the top edge of the main body of the first internal electrode layer, the first side edge of the main body of the first internal electrode layer, and the first lead tab extending from the bottom edge of the main body of the first internal electrode layer, wherein the third external terminal is electrically connected to the first internal electrode layer along the second lead tab extending from the top edge of the main body of the first internal electrode layer, and wherein the fourth external terminal is electrically connected to the first internal electrode layer along the second lead tab extending from the bottom edge of the main body of the first internal electrode layer.

20. The capacitor according to claim 18, wherein the external terminals include a fifth external terminal electrically connected to the second internal electrode layer along the top surface of the capacitor and a sixth external terminal electrically connected to the second internal electrode layer along the bottom surface of the capacitor, and wherein the first, third, and fourth external terminals have a first polarity and the second, fifth, and sixth external terminals have a second and opposite polarity.

* * * * *